(12) United States Patent
Huang et al.

(10) Patent No.: US 7,768,778 B2
(45) Date of Patent: Aug. 3, 2010

(54) HOLSTER FOR MOBILE ELECTRONIC APPARATUS

(75) Inventors: Chih-Chiang Huang, Taipei (TW); Cheng-Wen Huang, Taipei (TW); Chun-Hung Ho, Taipei (TW)

(73) Assignees: Giga-Byte Technology Co., Ltd., Taipei (TW); Giga-Byte Coomunications, Inc., Taipei (TW)

( * ) Notice: Subject to any disclaimer, the term of this patent is extended or adjusted under 35 U.S.C. 154(b) by 260 days.

(21) Appl. No.: 12/149,665

(22) Filed: May 6, 2008

(65) Prior Publication Data

US 2009/0073650 A1 Mar. 19, 2009

(30) Foreign Application Priority Data

Sep. 19, 2007 (TW) .............................. 96134990 A

(51) Int. Cl.
*G06F 1/16* (2006.01)

(52) U.S. Cl. .................. 361/679.56; 429/96; 340/5.1; 455/410; 345/558

(58) Field of Classification Search .................. 429/96, 429/14, 22; 361/679.27, 679.56, 679.03, 361/679.3, 679.31, 679.32; 340/5.1, 5.31, 340/539.13; 726/2, 7, 35; 455/410, 575.1, 455/575.4, 414.2, 351, 420; 345/169, 157, 345/173, 2.3, 558; 713/171, 324
See application file for complete search history.

(56) References Cited

U.S. PATENT DOCUMENTS 7,265,970 B2 * 9/2007 Jordan ................... 361/679.27
2009/0186264 A1 * 7/2009 Huang ......................... 429/96

FOREIGN PATENT DOCUMENTS

| TW | 501845 | 9/2002 |
| TW | 506577 | 10/2002 |
| TW | 511831 | 11/2002 |
| TW | 557688 | 10/2003 |

* cited by examiner

Primary Examiner—Hung V Duong
(74) Attorney, Agent, or Firm—Birch, Stewart, Kolasch & Birch LLP

(57) ABSTRACT

A holster for a mobile electronic apparatus includes a base plate provided with at least one retaining element for accommodating the mobile electronic apparatus; a first foldable plate formed adjacent to the base plate for protecting the mobile electronic apparatus; an extended device mounted on the first foldable plate, the extended device including: a connector for connecting the extended device to the mobile electronic apparatus, and at least one auxiliary unit for providing at least one function to the mobile electronic apparatus via the connector; and a control device for enabling and disabling the auxiliary unit according to a folded status or an unfolded status of the first foldable plate relative to the base plate.

7 Claims, 6 Drawing Sheets

HOLSTER FOR MOBILE ELECTRONIC APPARATUS

CROSS-REFERENCE TO RELATED APPLICATIONS

This nonprovisional application claims priority under 35 U.S.C. §119(a) on patent application No. 096134990, filed in Taiwan on Sep. 19, 2007, the entirety of which is incorporated herein by reference.

BACKGROUND OF THE INVENTION

1. Field of the Invention

The present invention generally relates to a holster, and more particularly, to a holster for a mobile electronic apparatus to protect the mobile electronic apparatus and to the provide power conservation mechanism.

2. Background of the Invention

A conventional holster for a mobile electronic apparatus, as disclosed in the Taiwanese Publication Nos. 501845, 511831, 506577 and 557688, is provided with a retention unit for accommodating the mobile electronic apparatus and an extra electronic device connected to the mobile electronic apparatus, which provides an additional function. However, once the extra electronic device is connected to the mobile electronic device or is turned on by a user, it will always keep in a power-on status even when the holster is folded. This extra electronic device will not be disabled until it is disconnected from the mobile electronic devices or is turned off by the user. Furthermore, when the holster is folded, an extended device inside the holster, such as a keyboard, a touch pad, a display screen, a display light, and a GPS/TV/GSM antenna, stop functioning because the mobile electronic apparatus is covered within the holster. What is worse is that the conventional extra electronic device still keeps in the power-on status, and the user will not be conscious of the waste of power-consumption of the extra electronic device.

SUMMARY OF THE INVENTION

One of the objectives of the present invention is to provide a foldable holster for a mobile electronic apparatus so as to protect the mobile electronic apparatus, to provide at least one additional function, and to prevent unnecessary power consumption.

To achieve the above-mentioned objects, according to a first aspect of the present invention, a holster for a mobile electronic apparatus includes a base plate provided with at least one retaining element for accommodating the mobile electronic apparatus; a first foldable plate formed adjacent to the base plate for protecting the mobile electronic apparatus; an extended device mounted on the first foldable plate, the extended device including: a connector for connecting the extended device to the mobile electronic apparatus, and at least one auxiliary unit for providing at least one function to the mobile electronic apparatus via the connector; and a control device for enabling and disabling the auxiliary unit according to a folded status or an unfolded status of the first foldable plate relative to the base plate.

According to a second aspect of the present invention, a holster for a mobile electronic apparatus includes a base plate provided with at least one retaining element for accommodating the mobile electronic apparatus; a first foldable plate formed adjacent to the base plate for protecting the mobile electronic apparatus; a second foldable plate formed adjacent to another edge of the base plate for protecting the mobile electronic apparatus; an extended device mounted on the first foldable plate, the extended device including: a connector for connecting the extended device to the mobile electronic apparatus, and at least one auxiliary unit for providing at least one function to the mobile electronic apparatus via the connector; and a control device for enabling and disabling the auxiliary unit according to a folded status or an unfolded status of the first foldable plate relative to the base plate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE ILLUSTRATED EMBODIMENTS

Figure 1:
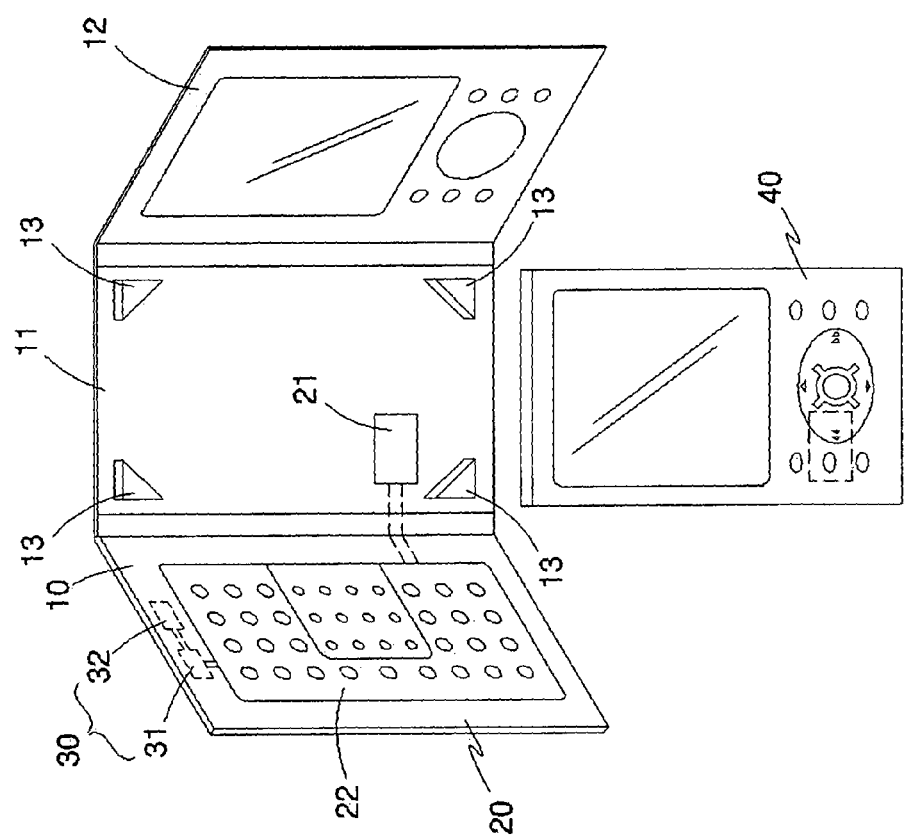
FIG. 1 is a three-dimensional exploded view of a holster in accordance with a first embodiment of the present invention.

The present invention will now be described in detail with reference to the accompanying drawings, wherein the same reference numerals will be used to identify the same or similar elements throughout the several views. It should be noted that the drawings should be viewed in the direction of orientation of the reference numerals.

Figure 2:
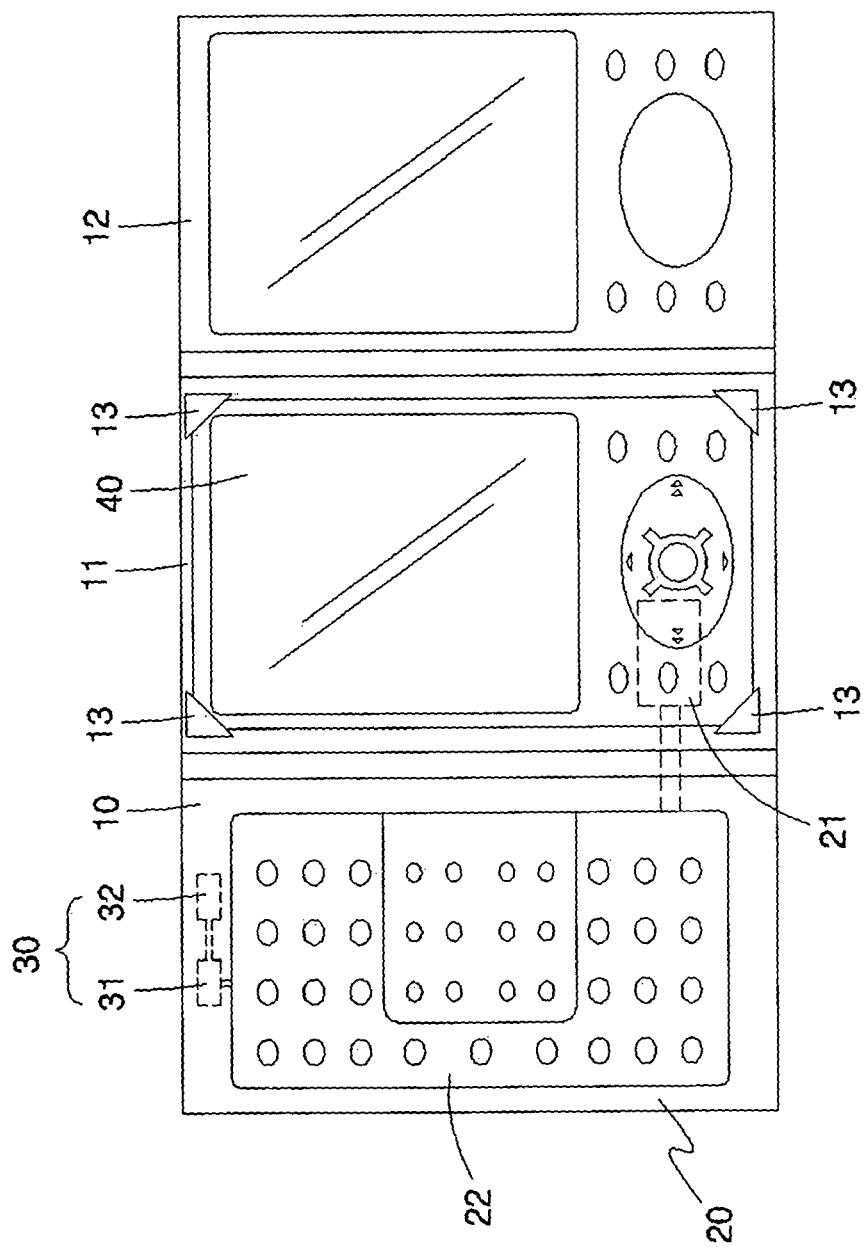
FIG. 2 is a plan schematic view of a holster in accordance with the first embodiment of the present invention.

Referring to FIGS. 1 and 2, a foldable holster for a mobile electronic apparatus according to a first embodiment of the present invention includes a first foldable plate 10, a base plate 11, a second foldable plate 12, an extended device 20, and a control device 30.

The base plate 11 is connected to the first foldable plate 10 at one lateral edge of the base plate 11, and is connected to the second foldable plate 12 at the other lateral edge of the base plate 11. The base plate 11 is provided with at least one retaining element 13 for accommodating the mobile electronic apparatus 40. Each of the first foldable plate 10, the base plate 11 and the second foldable plate 12 has a covering surface for covering an upper surface of the mobile electronic apparatus. The covering surface is larger than or equal to the upper surface of the mobile electronic apparatus 40. The first foldable plate 10 and the second foldable plate 12 can be folded inwardly along the lateral edges of the base plate 11 so as to cover the mobile electronic apparatus 40 in a folded status/position relative to the base plate 11. Alternatively, the first foldable plate 10 and the second foldable plate 12 can be unfolded outwardly in an unfolded status/position relative to the base plate 11 to expose the mobile electronic apparatus 40 to the user.

The extended device 20 has a connector 21 for connecting the mobile electronic apparatus 40 to an auxiliary unit 22, for example, a keyboard. The extended device 20 is installed on the first foldable plate 10, and provides at least one function to the mobile electronic apparatus 40 via the connector 21. It should be noted that, in addition to the keyboard, the auxiliary unit 22 can also be a touch pad, a display screen, a display light, a GPS/TV/GSM antenna, etc.

The control device 30 comprises a switch 31 which is provided on the first foldable plate 10 and is connected to the auxiliary unit 22 of the extended device 20 for enabling and disabling the auxiliary unit 22; and a sensor 32 which is provided on the first foldable plate 10 and is connected to the switch 31 for detecting the actions of the first foldable plate 10 and the base plate 11. When the sensor 32 detects that the first foldable plate 10 11 is in an unfolded position relative to the base plate 11, the switch 31 will be set to a "turn-on" mode. On the other hand, when the sensor 32 detects that the first foldable plate 10 is in a folded position relative to the base plate 11, the switch 31 will be set to a "turn-off" mode. The sensor 32 may be a photo-inductive element or a magnetic-inductive element, for examples. In addition, the sensor 32 may be installed on the base plate 11 or on the mobile electronic apparatus 40.

According to the first embodiment of the present invention, the first foldable plate 10 and the base plate 11 can protect the mobile electronic apparatus 40 and the auxiliary unit 22 from damage. The extended device 20 provides at least one additional function such as I/O function to enhance the expandability of the mobile electronic apparatus 40. The auxiliary unit 22 can be turned "on" or "off" in accordance with the folded or unfolded status/position of the first foldable plate 10 relative to the base plate 11 so as to prevent unnecessary power consumption. Moreover, in case that the auxiliary unit 22 is a keyboard or a touch device, the foldable plate 10 can prevent the user from inadvertently operating the auxiliary unit.

Figure 3:
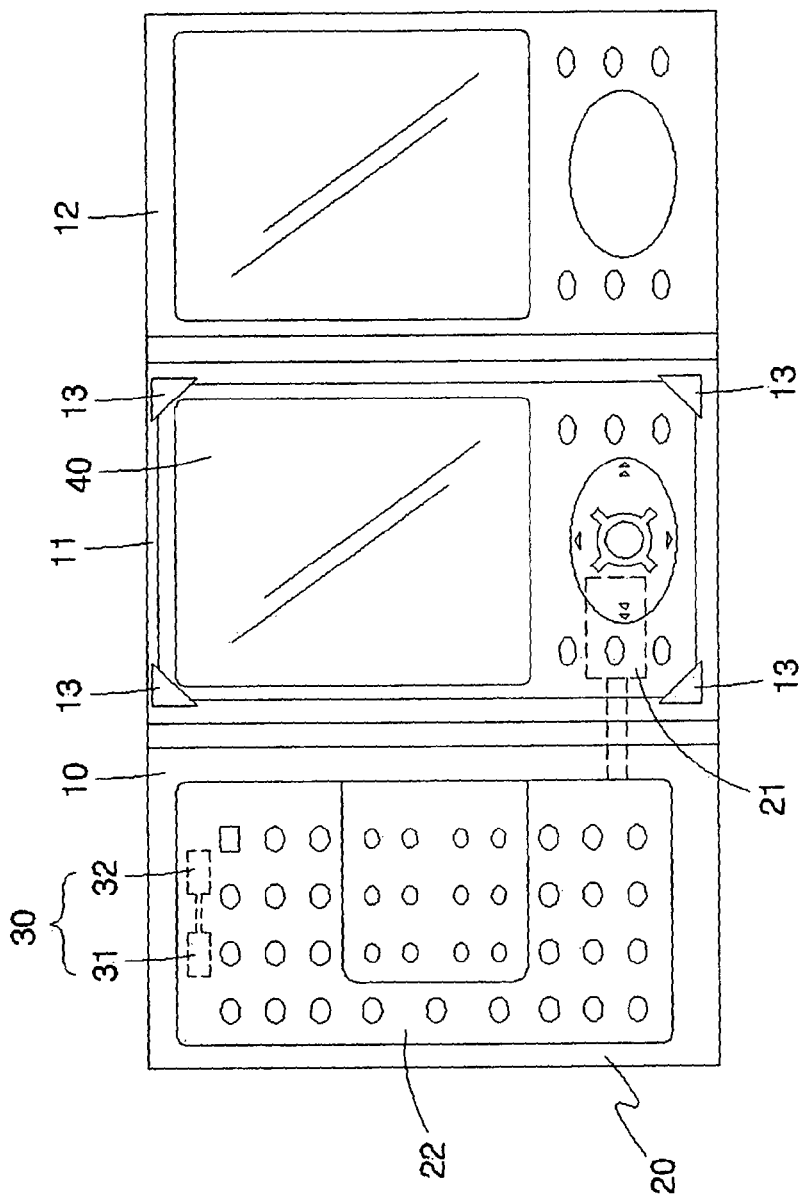
FIG. 3 is a plan schematic view of a holster in accordance with a second embodiment of the present invention.

FIG. 3 illustrates a holster in accordance with a second embodiment of the present invention. Different from the first embodiment, the switch 31 and the sensor 32 of the control device 30 in the second embodiment are not provided on the first foldable plate 10, but provided on the auxiliary unit 22 of the extended device 20.

Figure 4:
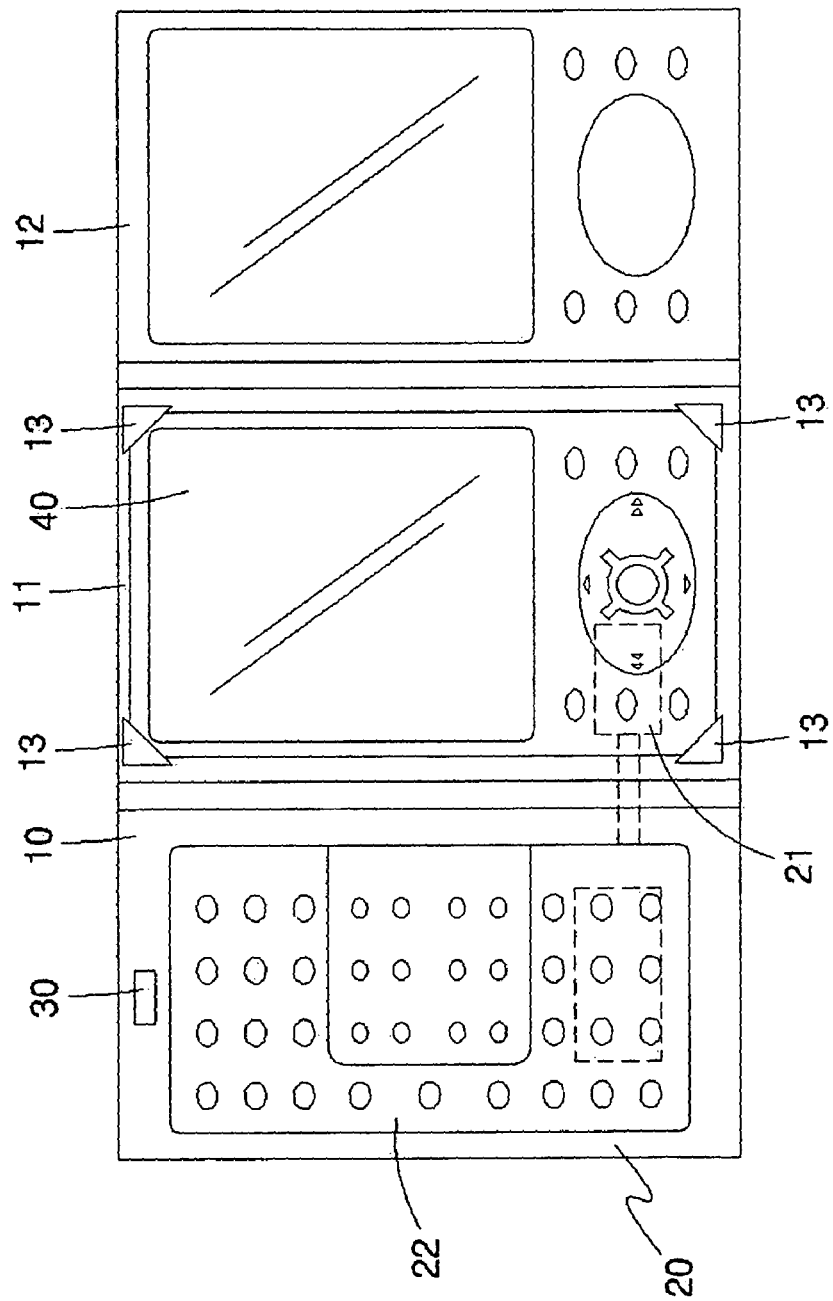
FIG. 4 is a plan schematic view of a holster in accordance with a third embodiment of the present invention.

FIG. 4 illustrates a holster in accordance with a third embodiment of the present invention. Different from the electronic controller of the first and second embodiments, the control device 30 in the third embodiment is a mechanical controller. By using the mechanical controller 30, the auxiliary unit 22 can be enabled or disabled according to a folded or an unfolded status/position of the first foldable plate 10 relative to the base plate 11 without using the sensor. The control device 30 according to the third embodiment can be installed on the first foldable plate 10, the base plate 11, the auxiliary unit 22, or the mobile electronic apparatus 40.

Figure 5:
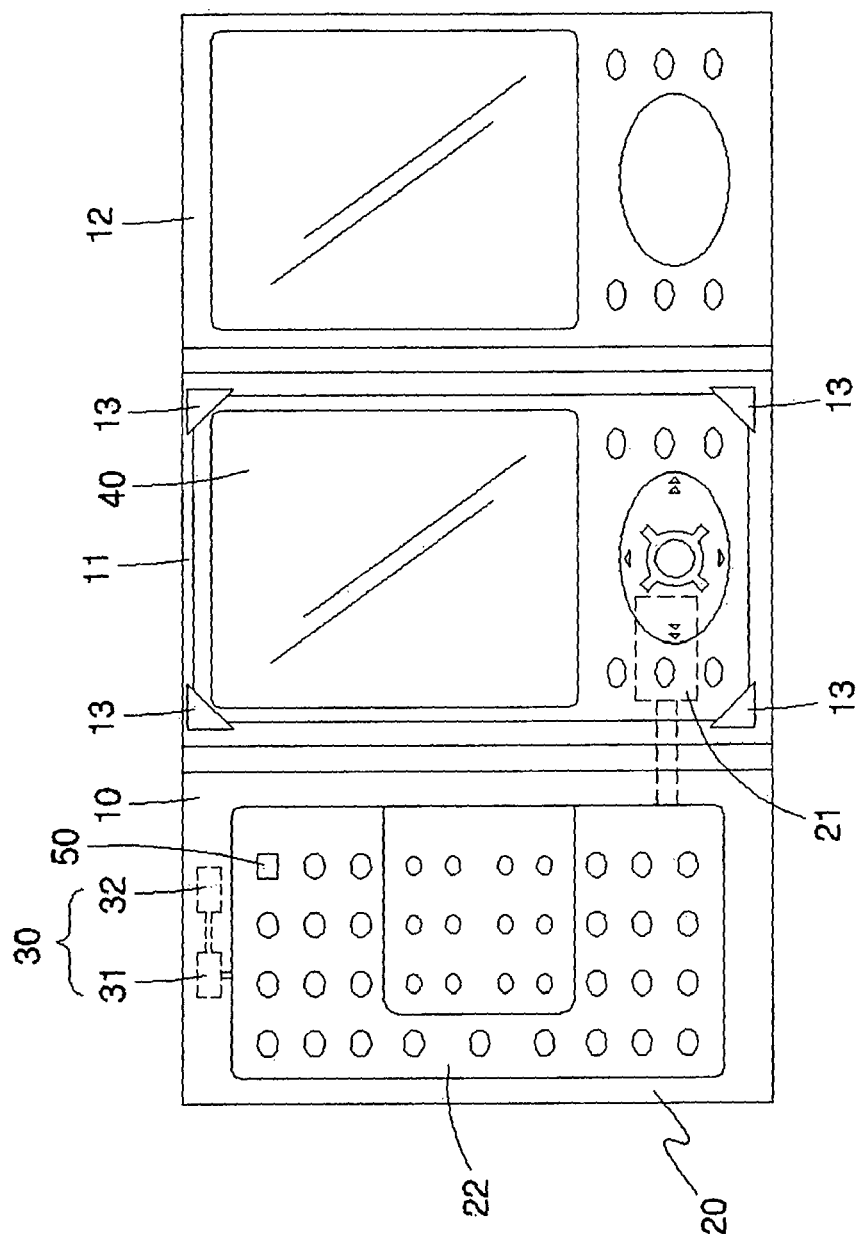
FIG. 5 is a plan schematic view of a holster in accordance with a fourth embodiment of the present invention.

FIG. 5 illustrates a holster in accordance with a fourth embodiment of the present invention. In the fourth embodiment, the control device 30 can only turn off the auxiliary unit 22 when the folded status/position of the first foldable plate 10 relative to the base plate 11 is detected, but cannot turn on the auxiliary unit 22 simply when the unfolded position of the first foldable plate 10 relative to the base plate 11 is detected. The illustrated holster for the mobile electronic apparatus further includes a manual switch 50, by which a user can manually turn on the auxiliary unit 22 when the first foldable plate 10 is in the unfolded status/position relative to the base plate 11. Therefore, when the first foldable plate 10 is folded relative to the base plate 11, the auxiliary unit 22 can be turned off automatically by the control device 30. If a user wants to turn the auxiliary unit 22 on, he needs to first unfold the first foldable plate 10 and the base plate 11, and then turn on the auxiliary unit 22 by manually switching the manual switch 50. This feature further prevents unnecessary power consumption because the user may not want to use the auxiliary unit 22 every time when he/she unfolds the first foldable plate 10. The manual switch 50 according to the fourth embodiment can be provided on the auxiliary unit 22, the first foldable plate 10, the base plate 11, or the mobile electronic apparatus 40.

Figure 6:
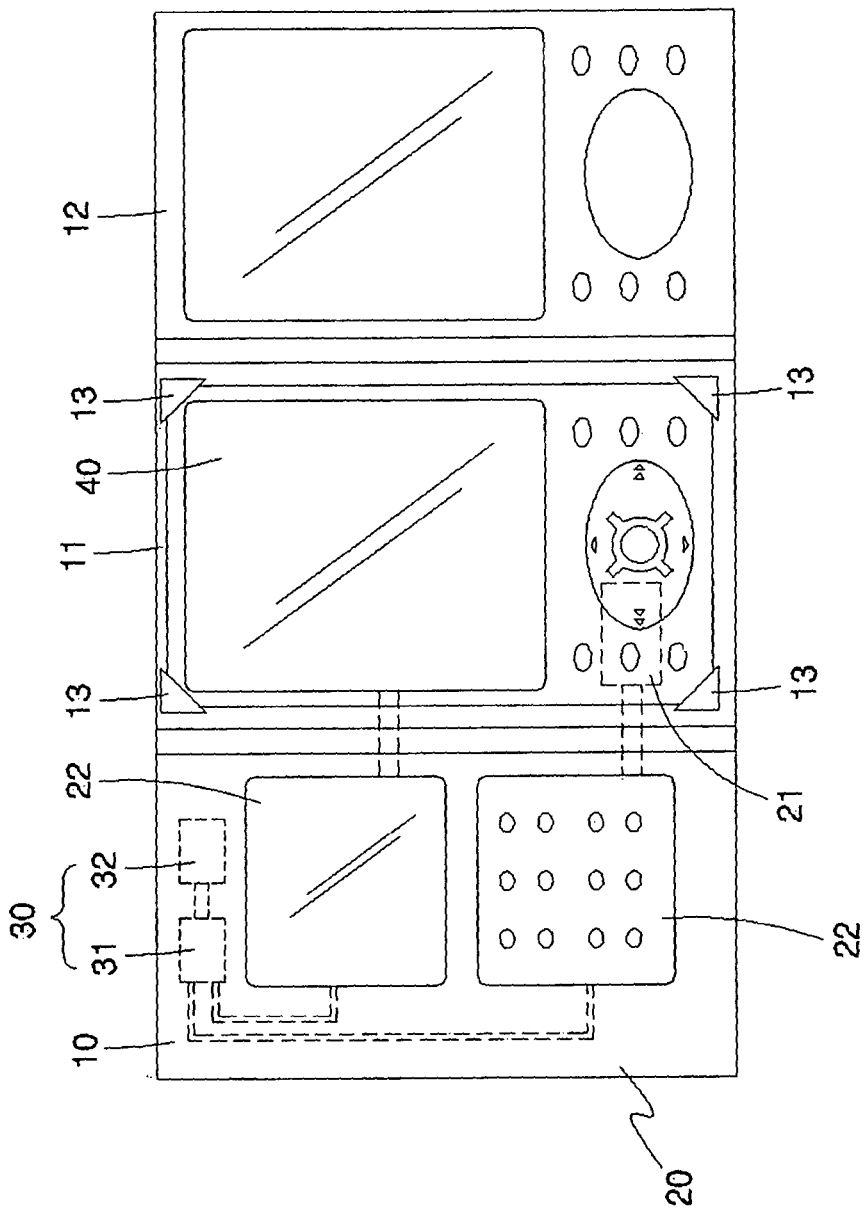
FIG. 6 is a plan schematic view of a holster in accordance with a fifth embodiment of the present invention.

FIG. 6 illustrates a holster in accordance with a fifth embodiment of the present invention. In the fifth embodiment, the extended device 20 includes more than one auxiliary unit 22. The auxiliary units 22 can be enabled and disabled by the control device 30 in accordance with the folded or unfolded status/position of the first foldable plate 10 relative to the base plate 11. For example, the extended device 20 includes two auxiliary units A and B. When the first foldable plate 10 is folded relative to the base plate 11, both auxiliary units A and B can be turned "off" by the control device 30 automatically. When the first foldable protective plate 10 is unfolded relative to the base plate 11, the auxiliary units can be controlled by the control device 30 in different predetermined ways. For example, when the first foldable protective plate 10 is unfolded relative to the base plate 11, either one or both auxiliary units A and B are enabled, or neither of the auxiliary unit A and B is enabled. It should be noted that the user may change the setting so as to control the on/off status of the auxiliary units in his/her preferred way when the first foldable protective plate 10 is unfolded relative to the base plate 11.

Although the extended device 20 and the mobile electronic device 40 are electronically connected by a tangible cable according to the above-mentioned embodiments, they can also be connected in a non-contacting form such as wireless transmission.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A holster for a mobile electronic apparatus, comprising:
   a base plate provided with at least one retaining element for accommodating the mobile electronic apparatus;
   a first foldable plate formed adjacent to the base plate for protecting the mobile electronic apparatus;
   an extended device mounted on the first foldable plate, the extended device including:
   a connector for connecting the extended device to the mobile electronic apparatus, and
   at least one auxiliary unit for providing at least one function to the mobile electronic apparatus via the connector; and
   a control device for enabling and disabling the auxiliary unit according to a folded status or an unfolded status of the first foldable plate relative to the base plate.

2. The holster according to claim 1, wherein the control device further comprises:
   a switch connected to the auxiliary unit for enabling and disabling the auxiliary unit; and a sensor connected to the switch for detecting the folded and unfolded statuses of the first foldable plate relative to the base plate, wherein the switch is turned on when the folded status is detected, and the switch is turned off when the unfolded status is detected.

3. The holster according to claim 1, further comprising a manual switch connected to the auxiliary unit for manually enabling and disabling the auxiliary unit when the first foldable plate is in the unfolded status relative to the base plate.

4. The holster according to claim 1, wherein the first foldable plate has a covering surface for covering an upper surface of the mobile electronic apparatus, the covering surface is larger than or equal to the upper surface of the mobile electronic apparatus.

5. A holster for mobile electronic apparatus, comprising:

a base plate provided with at least one retaining element for accommodating the mobile electronic apparatus;

a first foldable plate formed adjacent to one edge of the base plate for protecting the mobile electronic apparatus;

a second foldable plate formed adjacent to another edge of the base plate for protecting the mobile electronic apparatus;

an extended device, mounted on the first foldable plate, the extended device including:

a connector for connecting the extended device to the mobile electronic apparatus and at least one auxiliary unit for providing at least one function to the mobile electronic apparatus via the connector; and a control device for enabling and disabling the auxiliary unit according to a folded status or an unfolded status of the first foldable plate relative to the base plate.

6. The holster according to claim 5, further comprising a manual switch connected to the auxiliary unit for manually enabling and disabling the auxiliary unit when the first foldable plate and the base plate are in the unfolded status.

7. The holster according to claim 5, wherein the first foldable plate has a first covering surface for covering an upper surface of the mobile electronic apparatus, the second foldable plate has a second covering surface for covering the upper surface of the mobile electronic apparatus, and each of the first and second covering surfaces is larger than or equal to the upper surface of the mobile electronic apparatus.

* * * * *